(12) United States Patent
Paik

(10) Patent No.: US 7,749,826 B2
(45) Date of Patent: Jul. 6, 2010

(54) METHOD OF FABRICATING THIN FILM TRANSISTOR USING METAL INDUCED LATERAL CRYSTALLIZATION BY ETCH-STOPPER LAYER PATTERNS

(75) Inventor: Woon Suh Paik, Gyeonggi-do (KR)

(73) Assignee: Neopoly Inc., Seoul (KR)

( * ) Notice: Subject to any disclaimer, the term of this patent is extended or adjusted under 35 U.S.C. 154(b) by 0 days.

(21) Appl. No.: 11/157,828

(22) Filed: Jun. 22, 2005

(65) Prior Publication Data

US 2006/0003504 A1    Jan. 5, 2006

(30) Foreign Application Priority Data

Jun. 30, 2004    (KR) ...................... 10-2004-0050148

(51) Int. Cl.
 *H01L 21/84* (2006.01)
(52) U.S. Cl. .............................. 438/166; 257/E21.133; 438/486; 438/618
(58) Field of Classification Search ................. 438/486, 438/740, 166.486, 618; 257/E21.133
See application file for complete search history.

(56) References Cited

U.S. PATENT DOCUMENTS

| | | | | |
|---|---|---|---|---|
| 5,976,920 | A * | 11/1999 | Nakano et al. | 438/172 |
| 6,001,726 | A * | 12/1999 | Nagabushnam et al. | 438/618 |
| 6,096,658 | A * | 8/2000 | Gardner et al. | 438/720 |
| 7,202,501 | B2 * | 4/2007 | Kim et al. | 257/72 |

OTHER PUBLICATIONS

Wolf, Stanley et al., Silicon Processing for the VLSI Era, 2000, Lattice Press, vol. 1, p. 797-798.*

* cited by examiner

*Primary Examiner*—Asok K Sarkar
(74) *Attorney, Agent, or Firm*—Rosenberg, Klein & Lee

(57) ABSTRACT

A method of forming wires of a poly-crystalline TFT by crystallizing an amorphous silicon thin film using a metal film is provided. The wires forming method includes the steps of: removing a MILC metal film; forming etch-stopper layer patterns on at least part of respective source and drain regions formed on a semiconductor layer; forming an interlayer insulation film on the substrate; etching the interlayer insulation film to thereby form contact holes which expose the etch-stopper layer patterns of the source and drain regions; and forming a wires metal film contacting the etch-stopper layer patterns, and patterning the wires metal film to thus form metal wires. Thus, as the etch-stopper layer patterns are additionally installed at the contact positions, a silicon thin film can be protected at etching the interlayer insulation film.

2 Claims, 3 Drawing Sheets

METHOD OF FABRICATING THIN FILM TRANSISTOR USING METAL INDUCED LATERAL CRYSTALLIZATION BY ETCH-STOPPER LAYER PATTERNS

BACKGROUND OF THE INVENTION

1. Field of the Invention

The present invention relates to a method of fabricating a thin film transistor using a metal induced lateral crystallization (MILC) method, and more particularly, to a method of forming wires of a poly-crystalline thin film transistor by adding etch-stopper layer patterns when the poly-crystalline thin film transistor is fabricated using a MILC method, in which a silicon thin film of a semiconductor layer can be protected at the time of etching an interlayer insulation film for forming contact holes.

2. Description of the Related Art

In a method of forming a poly-crystalline silicon film which is used as a semiconductor layer of a thin film transistor, an amorphous silicon film is deposited on a substrate, and then processed at a predetermined temperature, to thus crystallize the amorphous silicon film into a poly-crystalline silicon film. Here, a metal induced lateral crystallization (MILC) method, a solid phase crystallization (SPC) method, and an eximer laser annealing (ELA) method are known as the amorphous silicon film crystallization method.

Among them, the MILC method does not only enable a batch processing using a conventional inexpensive heat treatment facility but also has many advantages of a relatively low processing temperature and a relatively short processing time.

A conventional method of fabricating a thin film transistor using a MILC method will follow with reference to FIGS. 1A through 1E.

FIGS. 1A through 1E are cross-sectional views for explaining a conventional thin film transistor fabrication method using a MILC technology, respectively.

Referring to FIG. 1A, an amorphous silicon film is deposited on an insulation substrate 10, and the amorphous silicon film is patterned using a semiconductor layer forming mask (not shown), to thereby form a semiconductor layer 11. Then, a gate oxide film and a gate electrode material are sequentially deposited on the entire surface of the substrate 10, and then sequentially patterned using a gate forming mask (not shown) to thereby form a gate electrode 13 and a gate insulation film 12.

Referring to FIG. 1B, high-concentration impurities are ion-injected on the substrate to form a source region 11S and a drain region 11D.

Referring to FIG. 1C, a photosensitive film is formed on the whole surface of the substrate, and then a photosensitive film pattern 14 which is slightly larger than the gate electrode 13 is formed. Then, a crystallization induced metal film 15 for metal induced lateral crystallization (MILC) (hereinafter referred to as a "MILC metal film") such as nickle (Ni) is deposited on the entire surface of the substrate, to thereby form a Ni silicide in the amorphous silicon film of the semiconductor layer 11.

Referring to FIG. 1D, the photosensitive film pattern 14 is removed by using a lift-off method, to thus remove part of the Ni MILC metal film 15, and thus the gate electrode 13 and the part of the semiconductor layer 11 are exposed. Then, a heat treatment is performed for crystallizing the amorphous silicon film into a poly-crystalline silicon film.

Referring to FIG. 1E, an interlayer insulation film 16 is deposited on the substrate 10. Then, the interlayer insulation film 16 is patterned using a contact forming mask (not shown) to thus form contact holes 17.

In general, amorphous silicon or crystallized poly-crystalline silicon is not etched by a solution of fluoric acid (HF) which is an etching solution of a silicon oxide film which is used as an insulation layer of an interlayer insulation film. However, if nickle (Ni) is deposited on a semiconductor layer for MILC and then a crystallization heat treatment process is undergone as described above, a metal such as nickle (Ni) is added onto the semiconductor layer made of a silicon film. Accordingly, the nickle-added semiconductor layer is etched by a fluoric acid solution at the time of forming contact holes.

Thus, when a poly-crystalline silicon thin film transistor is fabricated using a conventional MILC method as described above, an interlayer insulation film is formed and then contact holes are formed by a wet etching process, In this case, since a Ni-included silicon thin film located below the contact holes as well as an insulation film is etched by a fluoric acid solution, it is difficult to form a transistor. In particular, since a thickness of a silicon thin film of a thin film transistor is 500 Å or less, at a trend of using an extremely thin film, the etching problem becomes further severe.

Thus, in order to prevent the above-described conventional etching problem, a fluoric acid etching process is carefully executed or a concentration of the fluoric acid is adjusted, to thereby optimize an etching speed. Otherwise, a dry etching process is used. However, these processes are very complicated so as to require for much processing time. Also, electrical features of transistors are not consistent, to thus cause a decisive factor of lowering a yield to occur.

According to another conventional technology to prevent the conventional defective phenomenon, nickle (Ni) is deposited after etching contact holes. In this case, a distance to be crystallized by the MILC method, that is, a distance between a contact hole and a gate electrode is too long and thus unrealistic. In particular, a crystallization speed is too slow to be industrially applied in the case of an N-TFT (N-type Thin Film Transistor).

SUMMARY OF THE INVENTION

To solve the above problems, it is an object of the present invention to provide a method of forming wires of a poly-crystalline thin film transistor by adding etch-stopper layer patterns after an amorphous semiconductor thin film is crystallized using a MILC (Metal Induced Lateral Crystallization) method, in which a silicon thin film can be protected at the time of etching an interlayer insulation film for forming contact holes.

It is another object of the present invention to provide a method of fabricating a thin film transistor in which a crystallization heat treatment is executed and a metal wire is formed by a method of forming etch-stopper layer patterns before depositing an interlayer insulation film and a MILC metal film.

To accomplish the above object of the present invention, according to an aspect of the present invention, there is provided a method of forming wires of a poly-crystalline thin film transistor by crystallizing an amorphous silicon thin film of a semiconductor layer using a metal film for metal induced lateral crystallization (MILC), the wires forming method comprising the steps of: removing a MILC metal film; forming first and second etch-stopper layer patterns on at least part of respective source and drain regions formed on the semiconductor layer; forming an interlayer insulation film on the entire surface of the substrate; etching the interlayer insulation film to thereby form first and second contact holes which expose the first and second etch-stopper layer patterns of the source and drain regions; and forming a wires metal film contacting the first and second etch-stopper layer patterns exposed through the first and second contact holes, and patterning the wires metal film to thus form metal wires.

In this case, the etch-stopper layer patterns are preferably made of the same material as that of the metal wires, and can be made of a metal thin film which is not etched by a fluoric acid solution or a non-metal conductive thin film such as ITO (Indium Tin Oxide).

Also, the step of forming the first and second etch-stopper layer patterns comprises the sub-steps of: forming a photosensitive pattern on which first and second contact windows are formed in correspondence to positions where the etch-stopper layer patterns are formed; and depositing the etch-stopper layer patterns on the entire surface of the substrate and removing the photosensitive film using a lift-off method, to thereby make the first and second etch-stopper layer patterns locally contacting the semiconductor layer of the source region and the drain region via the first and second contact windows remain. Of course, the first and second etch-stopper layer patterns can be formed by forming etch-stopper layer patterns on the entire surface of the substrate and optically patterning the same using a general photosensitive film.

According to another aspect of the present invention, there is also provided a method of fabricating a thin film transistor comprising steps of: sequentially forming a semiconductor layer made of amorphous silicon, a gate insulation film and a gate electrode on an insulation substrate; ion-injecting impurities into the semiconductor layer to thus define a source region and a drain region; forming etch-stopper layer patterns on at least part of the source and drain regions; forming an interlayer insulation film on the entire surface of the substrate and patterning the interlayer insulation film to thereby form contact holes with respect to the etch-stopper layer patterns; etching the etch-stopper layer patterns formed at positions where the contact holes are formed to thereby expose the source and drain regions partially; depositing a metal induced lateral crystallization (MILC) metal film on the entire surface of the substrate to thus form the MILC metal film on the amorphous silicon thin film of the source and drain regions at the contact holes; heat treating the substrate to thus transform amorphous silicon into poly-crystalline silicon by a MILC method; and removing the MILC metal film and forming metal films for wiring contacting the source and drain regions exposed via the contact holes and patterning the wiring metal films, to thus form metal wires.

BRIEF DESCRIPTION OF THE DRAWINGS

The above and other objects and advantages of the present invention will become more apparent by describing the preferred embodiments thereof in detail with reference to the accompanying drawings in which.

DETAILED DESCRIPTION OF THE INVENTION

A preferred embodiment of the present invention will be described with reference to the accompanying drawings.

Figure 2A:
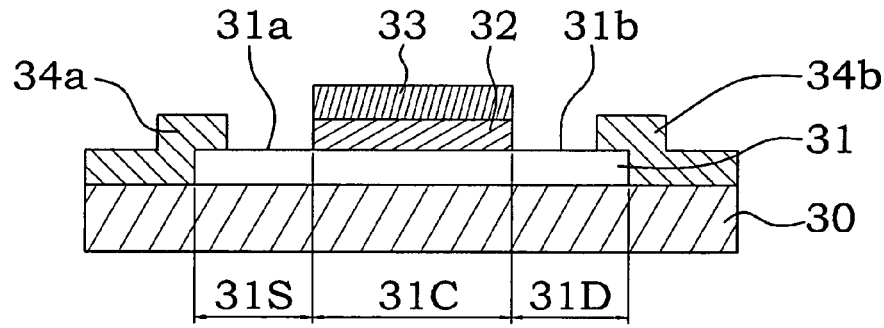
FIGS. 2A through 2C are cross-sectional views for explaining a method of fabricating a thin film transistor using a MILC method according to an embodiment of the present invention.
Figure 2B:
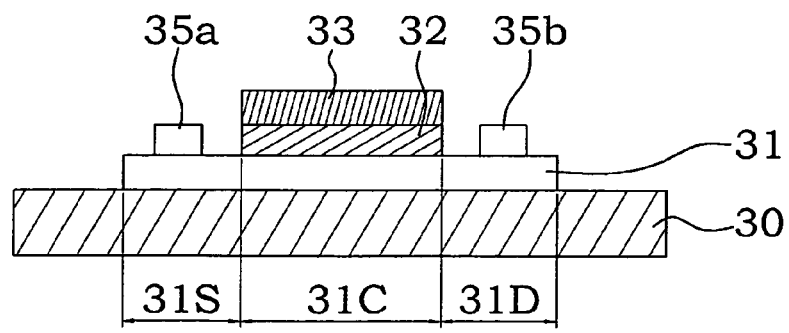
Figure 2C:
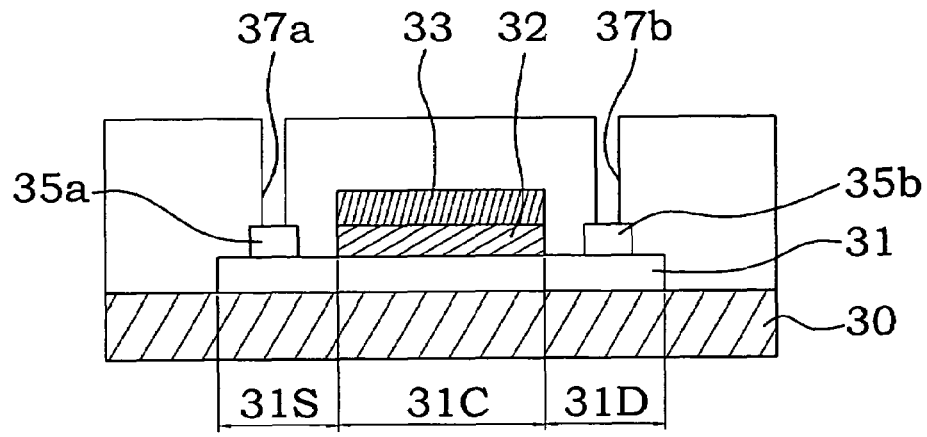

Referring to FIGS. 2A through 2C, a method of fabricating a thin film transistor using a metal induced lateral crystallization (MILC) method, according to an embodiment of the present invention will be described below.

Figure 1A:
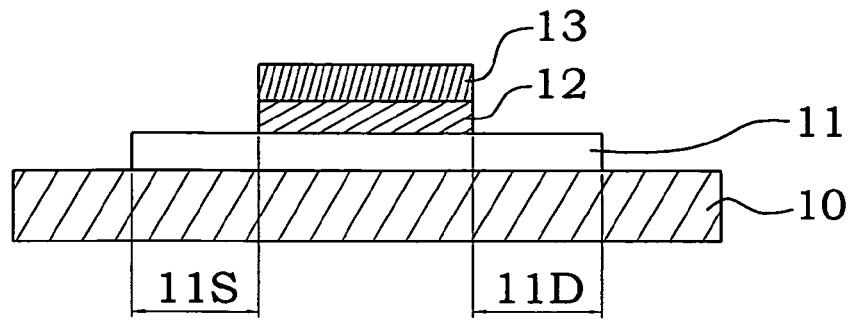
FIGS. 1A through 1E are cross-sectional views for explaining a conventional method of fabricating a thin film transistor using a metal induced lateral crystallization (MILC) method.
Figure 1B:
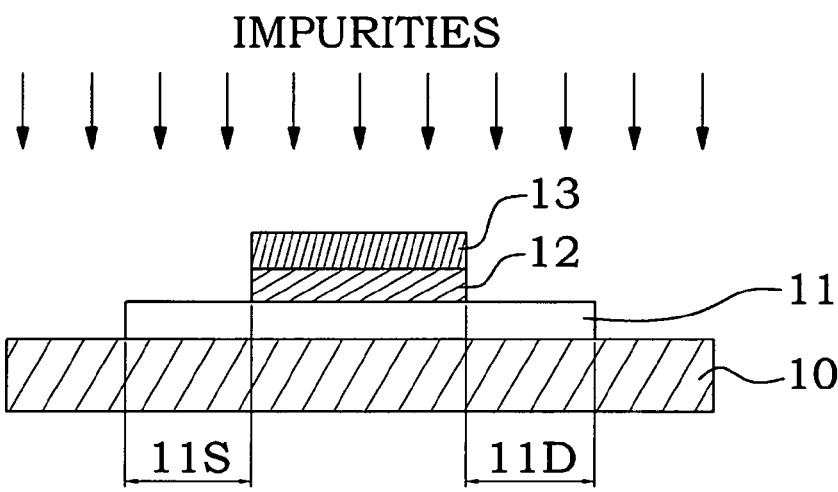
Figure 1C:
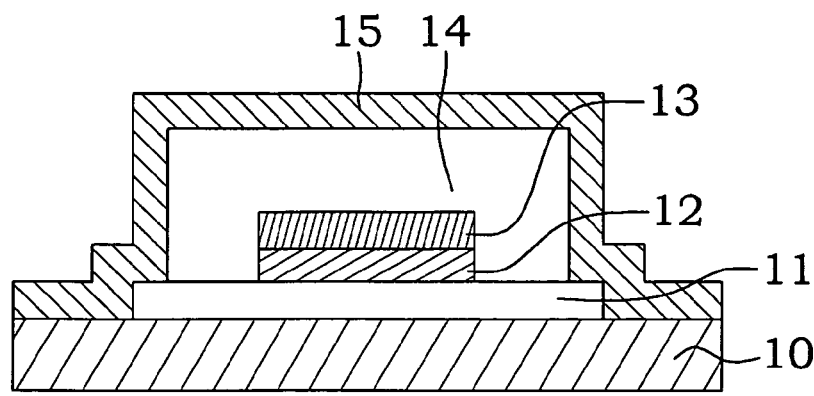
Figure 1D:
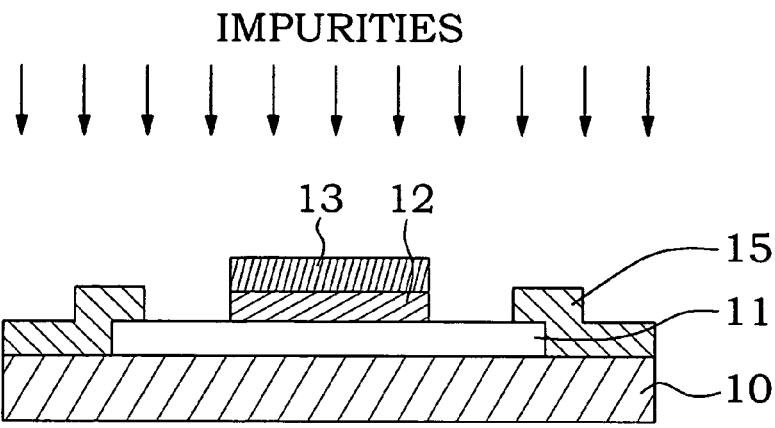
Figure 1E:
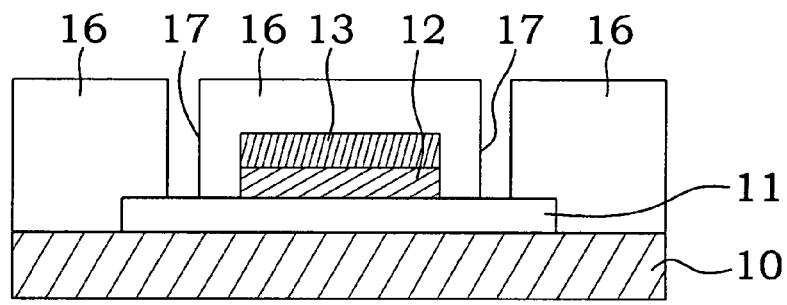

Referring to FIG. 2A, like the conventional process described with reference to FIGS. 1A through 1C, a semiconductor layer 31 made of amorphous silicon, a gate oxide film 32, and a gate electrode 33 are sequentially deposited on an insulation substrate 30. A source region 31S and a drain region 31D are defined in the semiconductor layer 31 by means of an ion-injection of impurities.

Thereafter, a photosensitive film is deposited on the whole surface of the substrate, and then a photosensitive film pattern 34 which is slightly larger than a gate pattern is formed. Then, a metal film for metal induced lateral crystallization (MILC) (hereinafter referred to as a "MILC metal film") is deposited on the entire surface of the substrate. As a result, metal silicide is formed in the amorphous silicon film of the semiconductor layer 31.

The MILC metal film is deposited with a thickness of 10~10,000 Å, preferably, 10~200 Å, on the insulation substrate 30 by any one of sputtering, evaporation by heating, PECVD (Plasma Enhanced Chemical Vapor Deposition), and a solution coating. Here, any one selected from the group consisting of Ni, Pd, Ti, Ag, Au, Al, Sn, Sb, Cu, Co, Cr, Mo, Tr, Ru, Rh, Cd, and Pt is used as the applicable material of the metal film.

Thereafter, the photosensitive film pattern on the substrate is removed by a lift-off method. Then, only MILC metal films 34a and 34b partially contacting the source/drain regions 31S and 31D remain, while the other metal film is removed. Accordingly, part of the semiconductor layer 31 between the gate insulation film 32 and the MILC metal films 34a and 34b is exposed. That is, off-set portions 31a and 31b of the source/drain regions 31S and 31D are exposed.

Of course, any other methods of forming a MILC metal pattern to be formed for MILC at a predetermined off-set distance from the gate insulation film 32 can be used.

At the state of FIG. 2A, the substrate is MILC-heat-treated at 400° C. through 600° C. under the inert gas atmosphere, hydrogen atmosphere, or vacuum atmosphere, to thereby crystallize the amorphous silicon film of the semiconductor layer 31 into a poly-crystalline silicon film and simultaneously activate the ion-injected impurities.

In this case, if the MILC heat treatment is executed, metal silicide formed in an interface with silicon is transferred to an amorphous silicon region by MIC (Metal Induced Crystallization) and MILC at the time of depositing a MILC metal film, to thereby crystallize amorphous silicon of the source region 31S, the drain region 31D, and a channel region 31C to be transformed into poly-crystalline silicon, in which crystalline silicon is formed at a region where silicide passes.

The MILC heat treatment can be executed in all facilities which can apply heat including a rapid or linear heat treatment by lamps, or a scan heat treatment by laser, as well as a general tubular furnace. In the case that the crystallization heat treatment is completed, the MILC metal films 34a and 34b are removed.

Referring to FIG. 2B, after removing the MILC films 34a and 34b, a metal film to be used as an etch-stopper layer pattern or a non-metal film having a conductive property such as indium tin oxide (ITO) is deposited, and then patterned using an etch-stopper layer pattern forming mask (not shown). Accordingly, a pair of etch-stopper layer patterns 35a and 35b are formed on the semiconductor layer 31 of the source region 31S and the drain region 31D.

The metal films for use in the etch-stopper layer patterns are thin films made of the same material as metal wires to be described later, and preferably formed over part of the contact holes or all the source and drain regions.

The etch-stopper layer patterns are used in order that a layer remaining below an interlayer insulation film may not be etched, at the time of patterning the interlayer insulation film after forming the interlayer insulation film. Thus, a material having a good contact resistance is selected as a material for the etch-stopper layer patterns which is not etched at the time of etching the interlayer insulation film and contacts the source and drain regions of a transistor. A metal film such as MoW, Mo, Al and Cu having the above-described features can be used as an etch-stopper layer. The etch-stopper metal film can be formed by sputter, CVD (Chemical Vapor Deposition) or Evaporator. The thickness thereof is 10 Å through 1,000 Å, preferably, 50 Å through 300 Å.

In addition to the method of forming the etch-stopper layer patterns, another method of forming etch-stopper layer patterns will be described with reference to FIGS. 3A through 3C.

Figure 3A:
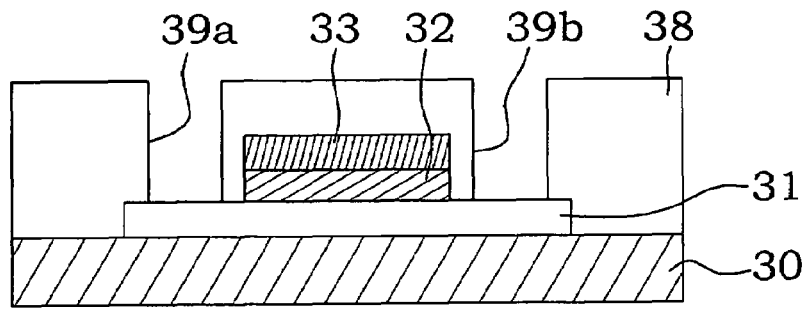
FIGS. 3A through 3C are cross-sectional views for explaining a method of forming etch-stopper layer patterns according to another embodiment of the present invention.
Figure 3B:
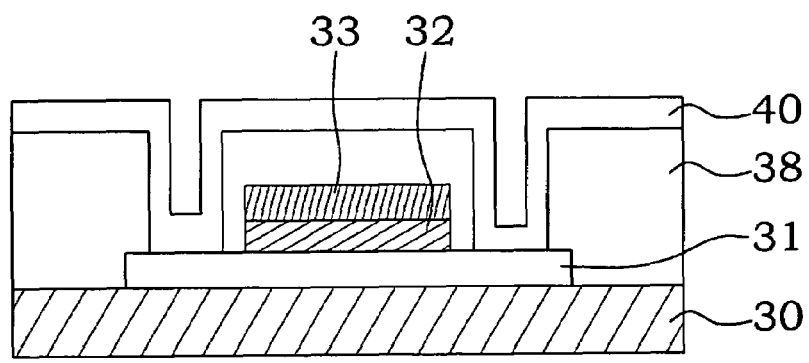
Figure 3C:
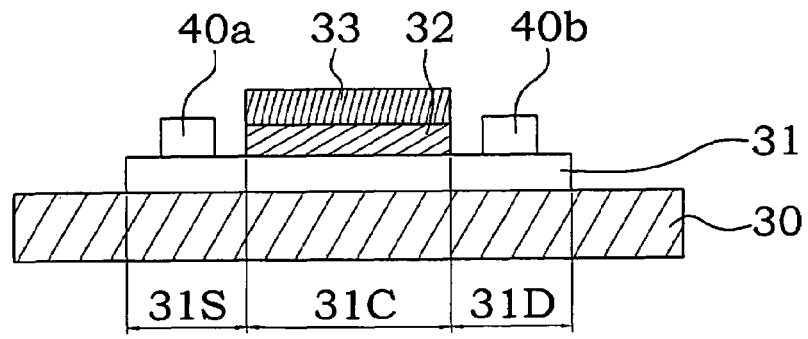

Referring to FIG. 3A, a photosensitive pattern 38 on which contact windows 39a and 39b are formed is formed in advance at a position where etch-stopper layer patterns are formed using an etch-stopper layer forming mask (not shown) before depositing etch-stopper layers. Then, as shown in FIG. 3B, an etch-stopper layer 40 is deposited on the entire surface of the substrate and the photosensitive pattern 38 is removed using a lift-off method. Accordingly, as shown in FIG. 3C, etch-stopper layer patterns 40a and 40b locally contacting a semiconductor layer 31 of a source region 31S and a drain region 31D, via the contact windows 39a and 39b, can be formed.

Referring to FIG. 2C, an interlayer insulation film 36 made of, for example, a silicon oxide film is formed on the entire surface of the substrate. Then, the interlayer insulation film 36 is patterned by a wet-etching process using a contact forming mask, to thereby form contact holes 37a and 37b for exposing the semiconductor layer 31 of a source region 36S and a drain region 31D, respectively. Here, the contact holes 37a and 37b should be positioned inside the etch-stopper layer patterns 35a and 35b without being beyond the etch-stopper layer patterns 35a and 35b.

Thus, since the etch-stopper layer patterns 35a and 35b are formed below places where the contact holes 37a and 37b are formed, respectively, the poly-crystalline silicon of the semiconductor layer 31 can be prevented from being etched although the contact holes 37a and 37b are formed by means of a fluoric acid (HF) solution which is an etching solution of a silicon oxide film used as the interlayer insulation film 36.

As described above, the etch-stopper layer patterns are formed before the interlayer insulation film is formed, to thereby effectively prevent the silicon film forming the semiconductor layer from being etched at the time of forming patterns of the contact holes by a wet-etching process. Also, a material having a high selection ratio is selected as etch-stopper layer patterns even in the case that a dry-etching process is used to form patterns of the contact holes. Thus, the patterns of the contact holes can be formed more easily and simply than the existing method.

The above-described method can match well a trend that thickness of a silicon thin film is reduced for an up-to-date display device.

Thereafter, wiring metal films contacting the etch-stopper layer patterns exposed via the contact holes are formed and then patterned, to thereby form metal wires.

In the above-described embodiment, processes of depositing and heat-treating and removing the MILC metal film and then forming etch-stopper layer patterns are illustrated. However, it is also possible to form etch-stopper layer patterns using a metal thin film at part or all of portions forming contact holes on a silicon substrate before the MILC metal film is deposited.

An example of a method of forming etch-stopper layer patterns before depositing a MILC metal film will be described below.

A semiconductor layer made of amorphous silicon, a gate oxide film, and a gate electrode are sequentially deposited on an insulation substrate. At a state where a source region and a drain region are defined in the semiconductor layer by means of an ion-injection of impurities, etch-stopper layer patterns are formed in the same manner as the above-described method in order to prevent a lower layer from being etched at the time of forming an interlayer insulation film.

Thereafter, an interlayer insulation film, for example, made of a silicon oxide film is formed on the entire surface of the substrate, and then the interlayer insulation film is patterned by a wet-etching or dry-etching process using a contact forming mask, to thus form contact holes. Etch-stopper layer patterns exposed at the portions where the contact holes are formed are etched, to thereby expose respective source and drain regions partially.

A metal film for metal induced lateral crystallization (MILC) is deposited on the entire surface of the substrate, to thereby make the MILC metal film deposited on the amorphous silicon thin film of the source and drain regions at the contact holes. Thereafter, MILC heat treatment is executed in the same manner as the above-described method, to thereby transform amorphous silicon into poly-crystalline silicon.

Thereafter, the MILC metal film is removed, and a wiring metal film contacting the source and drain regions exposed via the contact holes is formed and patterned, to thereby form metal wires.

As described above, the preferable embodiments of the present invention have been described with reference to the accompanying drawings. However, the present invention is not limited to the above-described embodiments. It is apparent to one who has an ordinary skill in the art that there may be many modifications and variations within the same technical spirit of the invention.

What is claimed is:

1. A method of forming wires for a poly-crystalline thin film transistor manufactured by crystallizing an amorphous silicon thin film of a semiconductor layer using a metal film for metal induced lateral crystallization (MILC), the wires forming method comprising the steps of:

removing a MILC metal film used to crystallize the amorphous silicon thin film formed on a substrate;

forming first and second etch-stopper layer patterns on at least part of said silicon thin film formed on the substrate, said first and second etch-stopper layer patterns corresponding to respective source and drain regions formed on the semiconductor layer;

forming an interlayer insulation film on the entire surface of the substrate, said interlayer insulation film covering said first and second etch-stopper layer patterns;

etching the interlayer insulation film to thereby form first and second contact holes which expose the first and second etch-stopper layer patterns of the source and drain regions; and forming a wires metal film contacting the first and second etch-stopper layer patterns exposed through the first and second contact holes, and patterning the wires metal film to thus form metal wires;

wherein said first and second etch-stopper layer patterns are made of the same material as said metal wires, said material being selected from a group consisting of MoW, Mo, Al and Cu;

wherein the step of forming the first and second etch-stopper layer patterns includes the following steps of:

forming a photosensitive pattern on which first and second contact windows are formed in correspondence to positions where the etch-stopper layer patterns are formed; and depositing the etch-stopper layer patterns on the entire surface of the substrate and removing the photosensitive film using a lift-off method, to thereby make the first and second etch-stopper layer patterns locally contacting the semiconductor layer of the source region and the drain region via the first and second contact windows remain.

2. The method according to claim 1, wherein the polycrystalline thin film transistor is obtained by a process comprising the steps of: forming a semiconductor layer made of an amorphous silicon thin film on an insulation substrate; forming a gate insulation film and a gate electrode on the substrate; ion-injecting high-concentration impurities into the semiconductor layer, to thereby form source and drain regions; locally depositing a metal film for metal induced lateral crystallization (MILC) in source and drain regions of the semiconductor layer, to thereby form metal silicide; and heat treating the substrate using the MILC metal film, to thereby crystallize an amorphous silicon thin film of the semiconductor layer.

* * * * *